United States Patent
Akulova et al.

(10) Patent No.: US 6,664,605 B1
(45) Date of Patent: Dec. 16, 2003

(54) DOPANT DIFFUSION BLOCKING FOR OPTOELECTRONIC DEVICES USING INALAS AND/OR INGAALAS

(75) Inventors: Yuliya A. Akulova, Allentown, PA (US); Sung-nee G. Chu, Murray Hill, NJ (US); Michael Geva, Allentown, PA (US); Mark S. Hybertsen, West Orange, NJ (US); Charles W. Lentz, Sinking Spring, PA (US); Abdallah Ougazzaden, Breinigsville, PA (US)

(73) Assignee: TriQuint Technology Holding Co., Hillsboro, OR (US)

( * ) Notice: Subject to any disclaimer, the term of this patent is extended or adjusted under 35 U.S.C. 154(b) by 0 days.

(21) Appl. No.: 09/539,882

(22) Filed: Mar. 31, 2000

(51) Int. Cl.$^7$ .................. H01L 31/0232; H01L 31/06
(52) U.S. Cl. .................. 257/432; 257/436; 257/461
(58) Field of Search .................. 257/431, 432, 257/436, 451, 461

(56) References Cited

U.S. PATENT DOCUMENTS

| | | | | |
|---|---|---|---|---|
| 4,868,612 A | * | 9/1989 | Oshima et al. ............. 357/4 |
| 5,214,662 A | * | 5/1993 | Irikawa et al. ............ 372/46 |
| 5,304,283 A | * | 4/1994 | Bouadma ................... 438/41 |
| 5,306,923 A | * | 4/1994 | Kazmierski et al. ......... 257/14 |
| 5,308,995 A | * | 5/1994 | Tsuji et al. ............... 257/17 |
| 5,319,657 A | * | 6/1994 | Otsuka et al. ............ 372/43 |
| 5,335,241 A |  | 8/1994 | Okumura et al. |
| 5,441,912 A |  | 8/1995 | Tsukiji et al. |
| 5,528,617 A |  | 6/1996 | Kobayashi et al. |
| 5,663,976 A |  | 9/1997 | Razeghi |
| 5,665,612 A |  | 9/1997 | Lee et al. |
| 5,901,265 A |  | 5/1999 | Tohyama et al. |
| 5,940,569 A |  | 8/1999 | Schimpe |
| 5,976,903 A | * | 11/1999 | Lee et al. ............... 372/20 |
| 6,261,855 B1 | * | 7/2001 | Suzuki ................... 438/23 |

FOREIGN PATENT DOCUMENTS

JP     360136286     * 7/1985

* cited by examiner

*Primary Examiner*—Eddie Lee
*Assistant Examiner*—Paul E Brock, II
(74) *Attorney, Agent, or Firm*—Dickstein Shapiro Morin & Oshinsky LLP

(57) ABSTRACT

A method for decreasing the diffusion of dopant atoms in the active region, as well as the interdiffuision of different types of dopant atoms among adjacent doped regions, of optoelectronic devices is disclosed. The method of the present invention employs a plurality of InAlAs and/or InGaAlAs layers to avoid the direct contact between the dopant atoms and the active region, and between the dopant atoms in adjacent blocking structures of optoelectronic devices. A semi-insulating buried ridge structure, as well as a ridge structure, in which the interdiffusion of different types of dopant atoms is suppressed are also disclosed.

52 Claims, 11 Drawing Sheets

DOPANT DIFFUSION BLOCKING FOR OPTOELECTRONIC DEVICES USING INALAS AND/OR INGAALAS

FIELD OF THE INVENTION

The present invention relates to a method for fabricating optoelectronic devices, such as lasers, modulators, optical amplifiers, and detectors, and in particular to a method and device for reducing the diffusion and/or interdiffusion of dopant atoms among differently doped regions of such optoelectronic devices.

BACKGROUND OF THE INVENTION

Blocking layers are increasingly important for optoelectronic devices. For example, in a buried heterostructure of a semiconductor laser diode, blocking layers confer superior characteristics, such as low oscillatory threshold value and stable oscillation transverse mode, as well as high quantum efficiency and high characteristic temperature. This is because, in the buried heterostructure laser diodes, a current blocking layer can be formed on both sides of an active laver formed between two clad layers having a large energy gap and a small refractive index. This way, current leakage during operation is substantially reduced, if not prevented.

A conventional method for the fabrication of semiconductor laser diodes having a semi-insulating buried ridge is exemplified in FIGS. 1–7 and described below.

Referring to FIG. 1, the processing steps for fabricating a laser diode with a buried ridge begin with the formation of a multi layered structure 100 on an n-InP substrate 10. The multi layered structure 100 is formed of a first n-InP cladding layer 12, an active layer 14, a second p-InP cladding layer 16, and a layer 18 of a quaternary material (Q). Layers 12, 14, 16 and 18 are sequentially formed and successively epitaxially grown to complete a first crystal growth. The active layer 14 could be, for example, a multiple quantum well (MQW) structure formed of undoped InGaAs/InGaAsP pairs and formed by a Metal Organic Chemical Vapor Deposition (MOCVD) or Metal Organic Vapor Phase Epitaxy (MOVPE). Also, the second cladding layer 16 may be doped with a p-type dopant, the most common one being zinc (Zn).

Next, as shown in FIG. 2, a $SiO_2$ or $Si_3N_4$ mask 20 is formed unto a stripe on the upper surface of layer 18. Subsequently, the multi layered structure 100 is selectively etched down to the n-InP substrate 10 to produce a mesa stripe 50, as illustrated in FIG. 3. The mesa stripe 50, which has the mask 20 on top, is then introduced into a growth system, such as a liquid phase epitaxial, a MOCVD, a molecular beam epitaxy (MBE), or vapor phase epitaxy (VPE) growth system, so that an InP current blocking layer 32 and an n-InP current blocking layer 34 are subsequently formed, as shown in FIG. 4. The current blocking layers 32 and 34 surround the mesa stripe 50 and form a second crystal growth.

The first current blocking layer 32 may be doped with impurity ions, such as iron (Fe), ruthenium (Ru) or titanium (Ti), to form a semi-insulating (si) InP(Fe) blocking layer 32. The addition of Fe-impurity ions increases the resistivity of the first current blocking layer 32 and reduces the leakage current that typically occurs at the interface between the substrate 10 and the first current blocking layer 32. Similarly, the second current blocking layer 34 may be doped with impurity ions, such as silicon (Si), sulfur (S) or tin (Sn), to form an n-type InP-doped blocking layer 34.

Referring now to FIG. 5, after removal of the mask 20, a third crystal growth is performed on the upper surfaces of the second current blocking layer 34 and the Q layer 18. Thus, a p-InP cladding layer 42 (also called a burying layer) and a p-InGaAsP or a p-InGaAs ohmic contact layer 44 are further grown to form a buried heterostructure. The cladding layer 42 may be also doped with p-type impurity ions, such as zinc (Zn), magnesium (Mg), or beryllium (Be), to form a p-type InP-doped cladding layer 42. Since Zn is the most commonly used p-type dopant, the cladding layer 42 will be referred to as layer InP(Zn)-doped.

The method of fabricating the above structure poses three major drawbacks, all of them relating to the diffusion and interdiffusion of dopant atoms, particularly those of zinc, since zinc is the most common and widely used p-type dopant in the optoelectronic industry.

First, zinc diffusion occurs into the active region of the semi-insulating buried ridge. FIG. 5 shows the diffusion of zinc in the direction of arrow A, from the doped p-InP(Zn) second cladding layer 16 into the active layer 14, because of the direct contact between the two layers. The high diffusivity of zinc leads to an undesirable shift in the emitting wavelength, up to tenths of microns. The reshaping of the overall zinc distribution profile further impacts the electrical characteristics of the optoelectronic device. The excess of zinc in the active region 14 of the device structure also results in the degradation of various device characteristics, such as the extinction ratio and the junction capacitance of the electro-absorption modulator strictures.

Second, iron-zinc (Fe—Zn) interdiffusion occurs at the interface between the doped p-InP(Zn) second cladding layer 16 and the semi-insulating InP(Fe) first current blocking layer 32. FIG. 5 shows the diffusion of zinc in the direction of arrow $B_1$, from the p-InP(Zn) second cladding layer 16 into the InP(Fe) first current blocking layer 32. Similarly, arrow $B_2$ of FIG. 5 illustrates the diffusion of iron from the InP(Fe) first current blocking layer 32 into the p-InP(Zn) second cladding layer 16.

Third, iron-zinc (Fe—Zn) interdiffusion occurs in the blocking structures of the laser devices, more precisely at the interface between the semi-insulating InP (Fe) first current blocking layer 32 and the p-InP(Zn) cladding layer 42. The problem arises because the Fe-doped InP current blocking layer 32, which was initially covered by the mask 20, comes into contact with the Zn-doped InP cladding layer 42 after the removal of the mask 20. The contact regions are exemplified in FIGS. 5 as regions D, situated on lateral sides of the mesa stripe 50. The interdiffusion of Fe and Zn atoms at the regions D can significantly increase the leakage current and degrade the device, leading to a poor manufacturing yield. In addition, if the active layer 14 has a multiple quantum well (MQW) structure, the Zn impurities in the Zn-doped InP cladding layer 42 can enter the active layer 14 to form mixed crystals therein and practically reduce the quantum effect to zero.

In an effort to suppress the diffusion and interdiffusion of Zn dopant atoms, different techniques have been introduced in the IC fabrication. For example, one technique of the prior art, shown in FIG. 6, considered the incorporation of a zinc doping set-back into the device structure, such as an undoped InP layer 52. The undoped InP layer 52 is grown after the growth of tie active layer 14, but before the growth of the p-InP second cladding layer 16, to prevent therefore the direct contact between zinc and the active region. In lieu of the undoped InP layer 52, a silicon doped n-InP(Si) layer may be used also as a dopant set-back.

Although the above technique has good results in preventing tie Zn diffusion, its processing steps require extremely sensitive parameters, such as doping level and thickness, of the zinc-doped cladding and contact layers. Also, growth conditions, such as growth rate and temperature, must be very narrowly tailored so that the set-back is optimized for each device structure and for each reactor. Further, this method does not allow control over the shape of the final zinc distribution. Finally, when a silicon doped n-InP(Si) layer is alternatively used as a dopant set-back, the incorporated silicon, which is an n-type dopant, forms an additional and undesirable p-n junction on the p-side of the device.

Another technique of the prior art that tried to minimize the zinc-iron interdiffusion is exemplified in FIG. 7. This technique contemplates the insertion of an intrinsic or undoped InP layer 70 between the Fe-doped InP current blocking layer 32 and the Zn-doped InP cladding layer 42, to prevent the contact between the InP(Fe) layer and InP(Zn) layer and to eliminate the iron-zinc interdiffusion and the consequent leakage current. This technique, however, has a major drawback in that it affects the p-n junction between the n-InP second current blocking layer 34 and the p-InP burying layer 42. Specifically, the addition of an intrinsic InP layer modifies the p-n junction that should be in the active region of a laser device, and creates instead a p-i-n junction that alters the device characteristics altogether. Further, this method is insufficient to completely prevent the iron-zinc interdiffusion in areas close to the active region of the device.

Accordingly, a method for forming a mesa stripe for optoelectronic devices, which is inexpensive to implement and capable of decreasing the leakage current and the interdiffusion of dopant atoms is needed. There is also a need for an optoelectronic semiconductor device having good operating characteristics with reduced impurity atoms interdiffusion, reduced leakage current, and improved accuracy and operation reliability.

SUMMARY OF THE INVENTION

The present invention provides a method for reducing the diffusion and/or interdiffusion of dopant atoms between differently doped regions of semi-insulating buried ridge structures of forward biased devices, such as lasers and optical amplifiers, and of reverse biased devices, such as electroabsorption modulators and detectors.

In a first embodiment of the present invention, either an InAlAs (indium aluminum arsenide) or an InGaAlAs (indium gallium aluminum arsenide) layer is grown on top of the active region, and before the zinc-doped cladding layer and the subsequent contact layer are grown. The blocking of zinc diffusion into the active layer by the insertion of a thin InAlAs or InGaAlAs layer allows a precise placement of the p-i junction, at less than 100 Angstroms, as well as minimal doping into the active region.

In a second embodiment of the present invention, an InAlAs or an InGaAlAs layer is first selectively grown on top of the active region and around the mesa structure, and only then are conventional InP and n-InP current blocking layers, which form a second crystal growth around the mesa, grown over the InAlAs or InGaAlAs layer. This way, the lateral interdiffusion between Fe atoms, from the InP(Fe) current blocking layer, and the Zn atoms, from the p-InP(Zn) second cladding layer situated on top of the active region, is suppressed since no contact between the two doped regions exists.

In yet a third embodiment of the invention, a plurality of InAlAs an and/or InGaAlAs layers are grown on top of the active region and around the mesa structure, as well as in lieu of the conventional second current blocking layer of the second crystal growth.

A fourth embodiment of the present invention is structurally similar to the third embodiment. However, in the fourth embodiment, the InP(Fe) current blocking layer is grown between two adjacent InAlAs and/or InGaAlAs layers, so that the InP(Fe) layer has minimal contact with the mask situated on top of the mesa stripe.

According to fifth and sixth embodiments of the present invention, a plurality of InAlAs and/or InGaAlAs layers are grown on top of the active region and around the mesa structure, as well as in between the blocking layers forming the second crystal growth. In the fifth embodiment, an InAlAs and/or InGaAlAs layer is grown after the two current blocking layers have been formed and as part of the second crystal growth. Conversely, in the sixth embodiment, an InAlAs and/or InGaAlAs layer is grown as part of the third crystal growth and before the top cladding layer is formed. In any case, these multiple InAlAs and/or InGaAlAs layers suppress the interdiffusion between Fe atoms, from the InP(Fe) current blocking layer, and the Zn atoms, from the p-InP(Zn) cladding layer of the third crystal growth. Multiple InAlAs and/or InGaAlAs layers may be incorporated in the blocking and/or cladding structures to confer optimized performance to the optoelectronic devices.

The above and other advantages of the present invention will be better understood from the following detailed description of the preferred embodiments, which is provided in connection with the accompanying drawings.

DETAILED DESCRIPTION OF THE PREFERRED EMBODIMENTS

Figure 1:
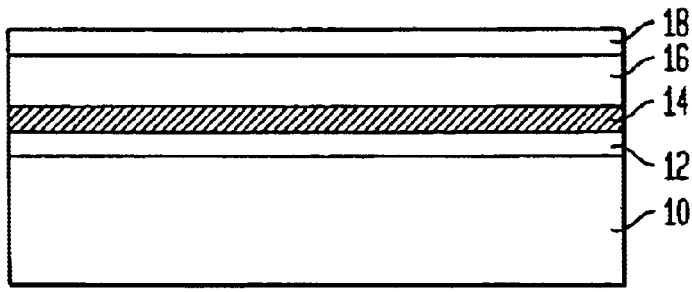
FIG. 1 illustrates a cross-sectional view of a buried heterostructure laser diode at an intermediate stage of processing in accordance with a method of the prior art.
Figure 2:
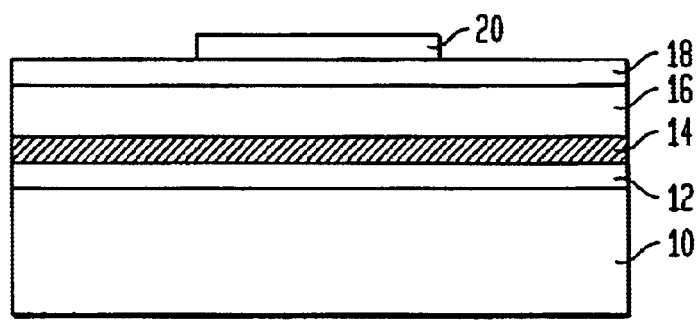
FIG. 2 is a cross-sectional view of the buried heterostructure laser diode of FIG. 1, in accordance with a method of the prior art and at a stage of processing subsequent to that shown in FIG. 1.

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the invention. Accordingly, the following detailed description is not to be taken in a limiting sense and the scope of the present invention is defined by the appended claims.

The present invention provides a method for decreasing the diffusion of dopant atoms in the active region, as well as the interdiffusion of different types of dopant atoms among adjacent doped regions of semi-insulating buried ridge structures of laser devices or optical amplifiers, and of ridge structures of electroabsorption modulators or detectors. The method of the present invention employs a plurality of InAlAs and/or InGaAlAs layers to avoid the direct contact between the dopant atoms and the active region, and between the dopant atoms in adjacent blocking structures of optoelectronic devices.

The term "p-type dopant" used in the following description may include any p-type impurity ions, such as zinc (Zn), magnesium (Mg), or beryllium (Be), among others. Since Zn is the most commonly used p-type dopant, reference to the p-type dopant will be made in this application as to Zn dopant. Although the present invention will be described and demonstrated above with respect to Zn dopant, it is anticipated that the plurality of InAlAs and/or InGaAlAs layers of the present invention will serve to block other p-type dopants as well.

Similarly, the term "n-type dopant" used in the following description may include any n-type impurity ions, such as silicon (Si), sulfur (S), or tin (Sn), among others. Although reference to the n-type dopant will be made in this application as to Si dopant, and although the present invention will be described with respect to Si dopant, it is anticipated that the plurality of InAlAs and/or InGaAlAs layers of the present invention will serve to block other n-type dopants as well.

The term "semi-insulating-type impurity" used in the following description may include any impurity ions, such as iron (Fe), ruthenium (Ru) or titanium (Ti), that form semi-insulating blocking layers. Since Fe is the most commonly used semi-insulating type impurity, reference to the semi-insulating-type dopant will be made in this application as to Fe dopant. Also, although the present invention will be described and demonstrated above with respect to Fe, it is anticipated that the plurality of InAlAs and/or InGaAlAs layers of the present invention will serve to block other semi-insulating-type dopants as well. Accordingly, the following detailed description must not be taken in a limiting sense, the scope of the present invention being defined by the appended claims.

Referring now to the drawings, where like elements are designated by like reference numerals, FIGS. 8–13 illustrate the fabrication method of the first embodiment of a buried semi-insulating ridge heterostructure 201 (FIG. 13) of the present invention, in which Zn diffusion into the active region of the optoelectronic device is suppressed.

Figure 8:
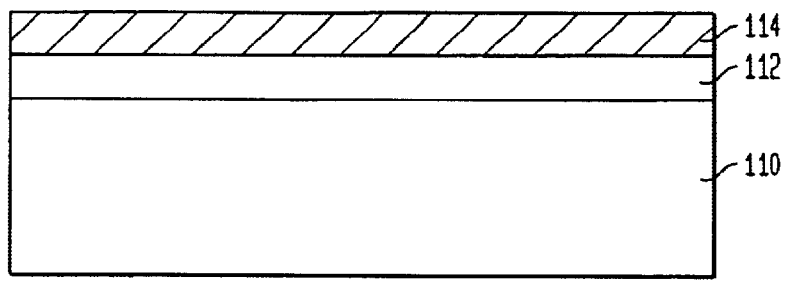
FIG. 8 illustrates a cross-sectional view of a buried heterostructure laser diode at an intermediate stage of processing and in accordance with a first embodiment of the present invention.

First, as shown in FIG. 8, preferably on an n-InP substrate 110 having a <100> plane as a main plane, a first cladding layer 112 of n-InP and an active layer 114 having a quantum well structure of InGaAsP are preferably successively epitaxially grown. It must be noted that, although the Metal Organic Vapor Phase Epitaxy (MOVPE) method is preferred, a Liquid Phase Epitaxy (LPE) method, a Vapor Phase Epitaxy (VPE) method, or a Molecular Beam Epitaxy (MBE) could also be used as an alternative. As known in the art, the active layer 114 should be capable of absorbing, emitting, amplifying, or modulating light, depending on the particular type of optoelectronic device. Also, although the present invention refers to an exemplary n-type substrate on which operative layers form an n-p junction around an active area, it is to be understood that the present invention also contemplates a p-type substrate on which a corresponding p-n junction is formed around an active area.

Further, although the embodiments of the present invention will be described below with reference to an InAlAs layer as blocking the diffusion and/or interdiffusion of different types of dopant impurities, it must be understood that same processing conditions and proceedings are applicable for an InGaAlAs layer used as a diffusion blocking layer. Thus, the present invention is not limited to the use of InAlAs as a dopant diffusion blocking layer, and the invention has equal applicability to the use of InGaAlAs as a dopant diffusion blocking layer, or a combination of InAlAs and InGaAlAs layers.

Figure 9:
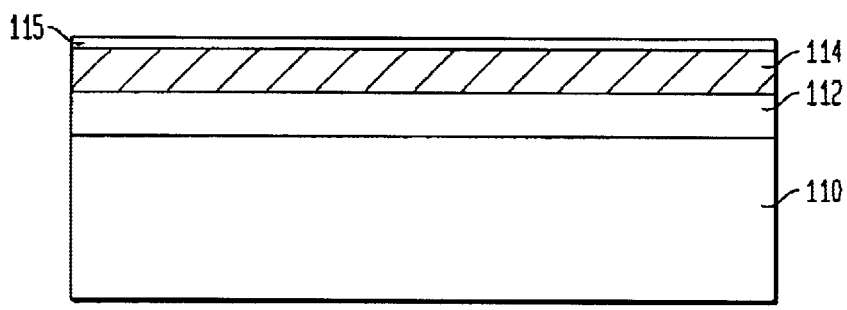
FIG. 9 is a cross-sectional view of the buried heterostructure laser diode of FIG. 8 at a stage of processing subsequent to that shown in FIG. 8.

As next illustrated in FIG. 9, an InAlAs layer 115 is formed on top of the active layer 114. The InAlAs layer 115 may be, for example, epitaxially grown up to a thickness of between approximately 300 Angstroms to approximately 800 Angstroms, by either the MOVPE or the LPE method. Although the embodiments of the present invention will be described with reference to the InAlAs and/or InGaAlAs layer 115 being formed on top of the active region 114, it must be understood that the active region may be also bounded on at least one side by the dopant blocking layer. The term "bounded" in the context of this application means that the dopant blocking layer is in contact or spaced apart from the active region through another region or layer. In any case, the InAlAs layer 115 acts as a zinc diffusion barrier layer, blocking the diffusion of Zn atoms from the subsequently grown upper layers into the active layer 114.

The incorporation of a thin layer of InAlAs offers an additional advantage. That is, the InAlAs layer does not introduce excess potential barriers for majority carriers or holes, since the InAlAs layer forms type II heterojunctions with the adjacent layers, the active layer (for example, the active layer 114 of FIG. 10) and the cladding layer (for example, the cladding layer 116 of FIG. 10). The InAlAs layer has a band gap (E=1.44 eV) that is higher than the band gap of the active region (E=0.8 eV) and than the band gap of the adjacent cladding layer (for example, E=1.35 eV for the InP cladding layer 116). Because of these differences, no body of carriers is created between the cladding layer and the active region because of the lineup of the band gaps.

Figure 10:
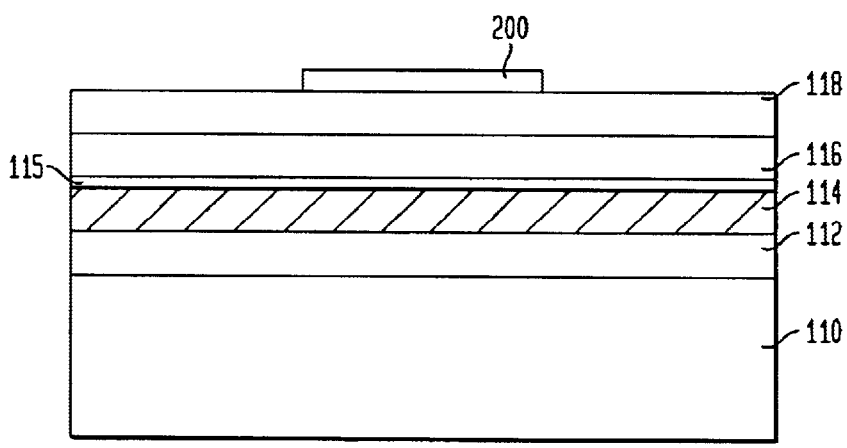
FIG. 10 is a cross-sectional view of the buried heterostructure laser diode of FIG. 8 at a stage of processing subsequent to that shown in FIG. 9.

Next, after the formation of the InAlAs layer 115, the processing steps for the formation of a semi-insulating buried ridge of a laser diode proceed according to the steps described with reference to FIGS. 1–5, and in accordance with the prior art. As such, a second cladding layer 116 preferably of p-InP doped with Zn and a Q layer 118 are preferably epitaxially grown, as illustrated in FIG. 10. Using a silicon oxide or silicon nitride mask 200 (FIG. 10), the multi layered structure of FIG. 10 is etched down to the n-InP substrate 110 to form a narrow striped-shaped ridge structure, or a mesa stripe, 150 (FIG. 11) on the substrate 110. The etching may be carried out by using, for example, a conventional Br-methanol solution or a solution comprising a mixture of oxygenated water and hydrochloric acid.

Figure 3:
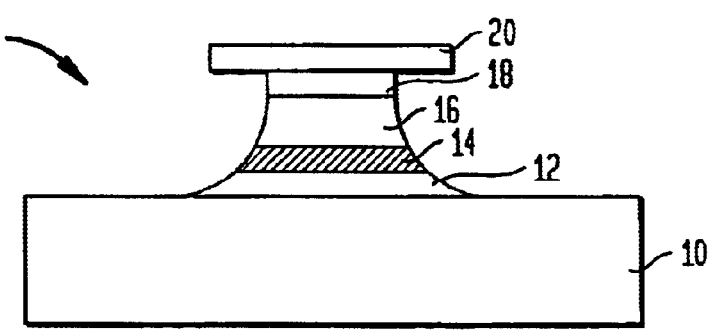
FIG. 3 is a cross-sectional view of the buried heterostructure laser diode of FIG. 1 at a stage of processing subsequent to that shown in FIG. 2.
Figure 4:
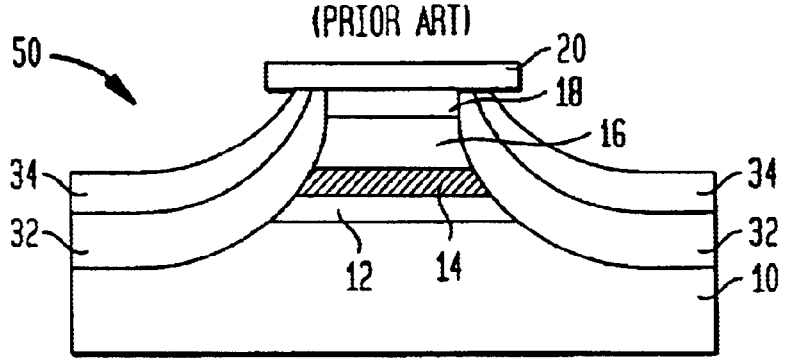
FIG. 4 is a cross-sectional view of the buried heterostructure laser diode of FIG. 1 at a stage of processing subsequent to that shown in FIG. 3.
Figure 5:
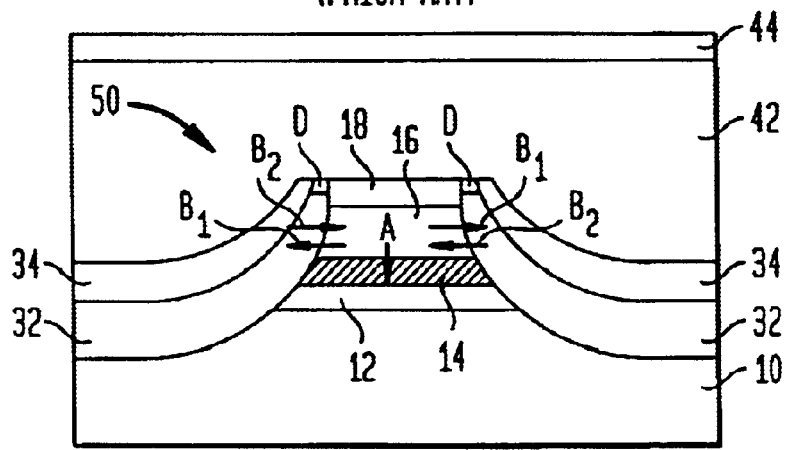
FIG. 5 is a cross-sectional view of the buried heterostructure laser diode of FIG. 1 at a stage of processing subsequent to that shown in FIG. 4.
Figure 6:
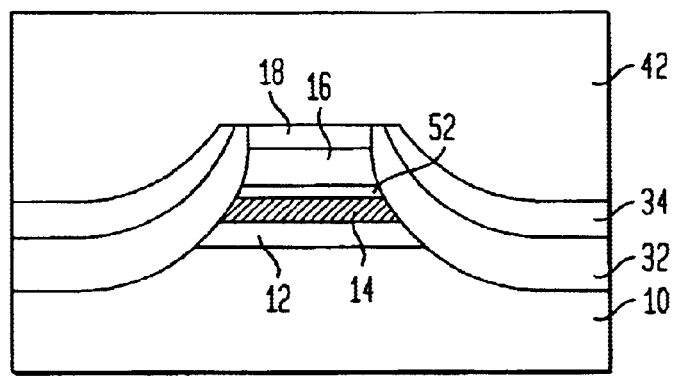
FIG. 6 is a cross-sectional view of a modified buried heterostructure laser diode of FIG. 1 and depicting an undoped InP layer grown on the active region of the laser diode.
Figure 7:
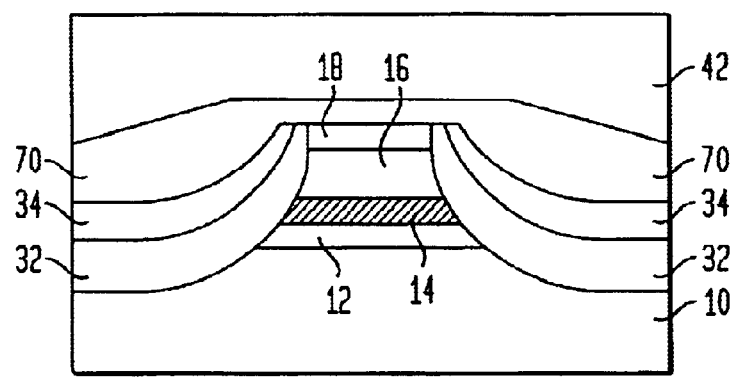
FIG. 7 is a cross-sectional view of the buried heterostructure laser diode of FIG. 1 at a stage of processing subsequent to that shown in FIG. 5, and depicting an intrinsic InP layer.
Figure 11:
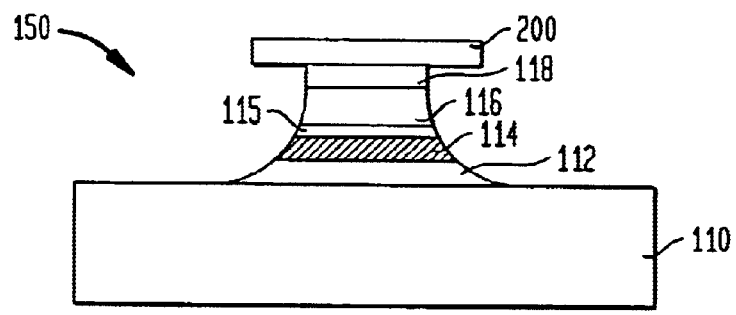
FIG. 11 is a cross-sectional view of the buried heterostructure laser diode of FIG. 8 at a stage of processing subsequent to that shown in FIG. 10.

The striped-shaped ridge structure 150 of FIG. 11, which is similar to that represented in FIG. 3, comprises portions of the first cladding layer 112 of n-InP, of the active layer 114, of the InAlAs zinc blocking layer 115, of the second cladding layer 116 of p-InP(Zn), and of the Q layer 118. As illustrated in FIG. 11, the striped-shaped ridge structure 150 resides on an upper surface of the n-InP substrate 110.

Figure 12:
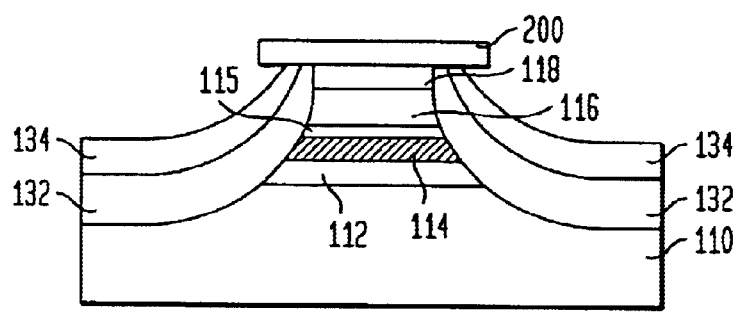
FIG. 12 is a cross-sectional view of the buried heterostructure laser diode of FIG. 8 at a stage of processing subsequent to that shown in FIG. 11.

Thereafter, striped-shaped ridge structure 150, which has on top the mask 200, is introduced into a liquid phase epitaxial growth system or a MOCVD growth system to preferably form a first InP current blocking layer 132 and an n-InP current blocking layer 134, as shown in FIG. 12. Preferably, the current blocking layers 132 and 134 are grown selectively by Metal Organic Vapor Phase Epitaxn (MOVPE) around the striped-shaped ridge structure 150. The current blocking layer 132 is preferably doped with a semi-insulating type dopant, such as iron (Fe), ruthenium (Ru), or titanium (Ti), in the range of $1 \times 10^{18}$ cm$^{-3}$ to $3 \times 10^{18}$ cm$^{-3}$, to achieve the semi-insulating (si) InP-doped current blocking layer, in our case the first semi-insulating current blocking layer InP(Fe) 132 (FIG. 12). Similarly, the second current blocking layer 134 may be doped with impurity ions such as silicon (Si), sulfur (S), or tin (Sn) to form an n-type InP-doped blocking layer 134.

Figure 13:
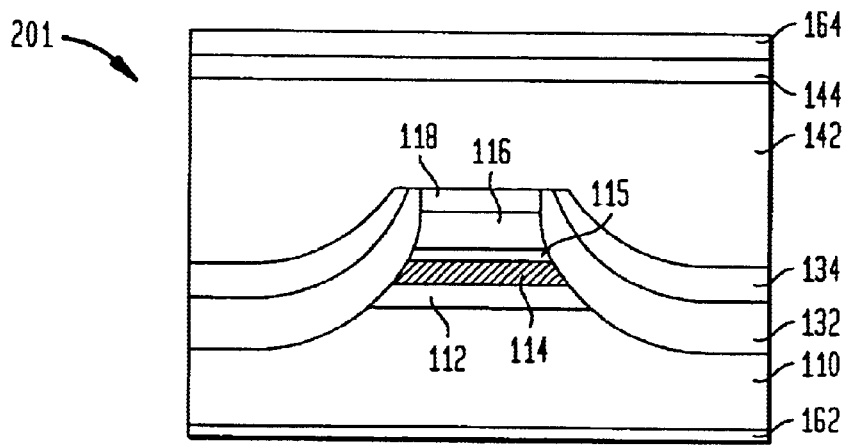
FIG. 13 is a cross-sectional view of the buried heterostructure laser diode of FIG. 8 at a stage of processing subsequent to that shown in FIG. 12.
Figure 16:
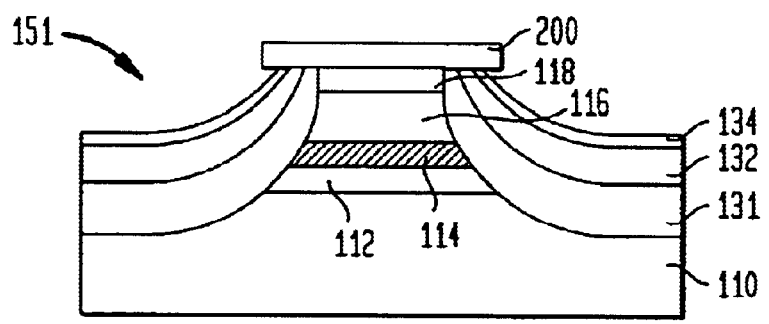
FIG. 16 is a cross-sectional view of the buried heterostructure laser diode of FIG. 14 at a stage of processing subsequent to that shown in FIG. 15.
Figure 17:
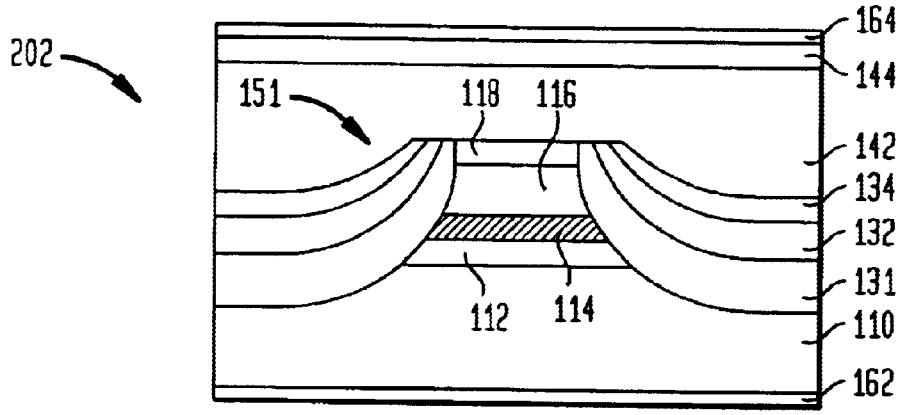
FIG. 17 is a cross-sectional view of the buried heterostructure laser diode of FIG. 14 at a stage of processing subsequent to that shown in FIG. 16.
Figure 18:
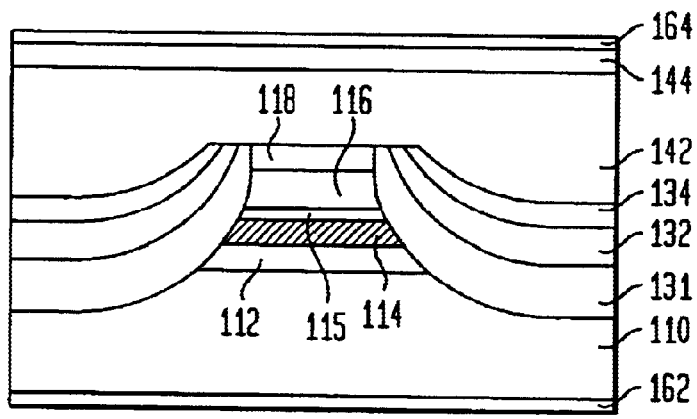
FIG. 18 is a cross-sectional view of the buried heterostructure laser diode of FIG. 17 but which includes an InAlAs or InGaAlAs layer on top of the active region of the heterostructure laser diode.
Figure 22:
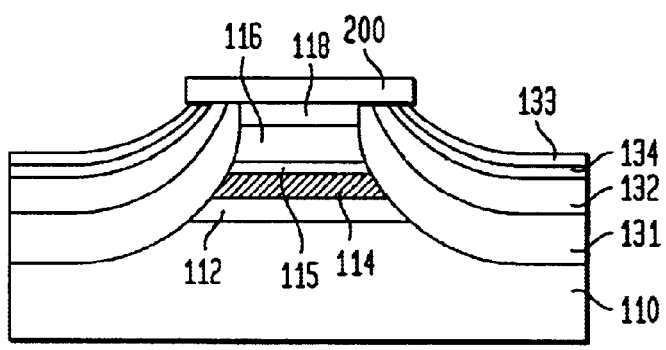
FIG. 22 is a cross-sectional view of a buried heterostructure laser diode at an intermediate stage of processing and in accordance with a fifth embodiment of the present invention.
Figure 23:
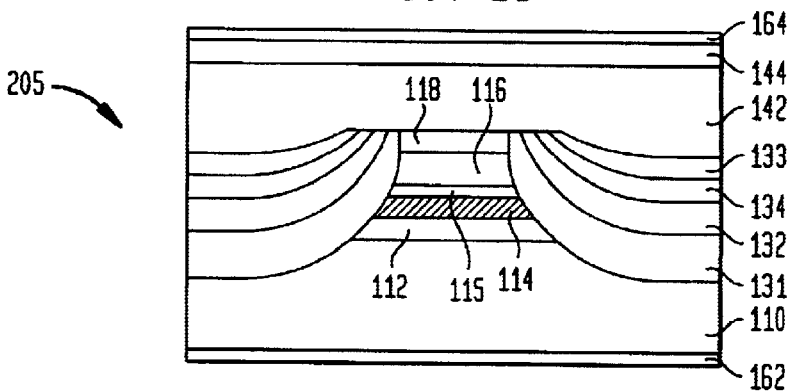
FIG. 23 is a cross-sectional view of the buried heterostructure laser diode of FIG. 22 at a stage of processing subsequent to that shown in FIG. 22.
Figure 24:
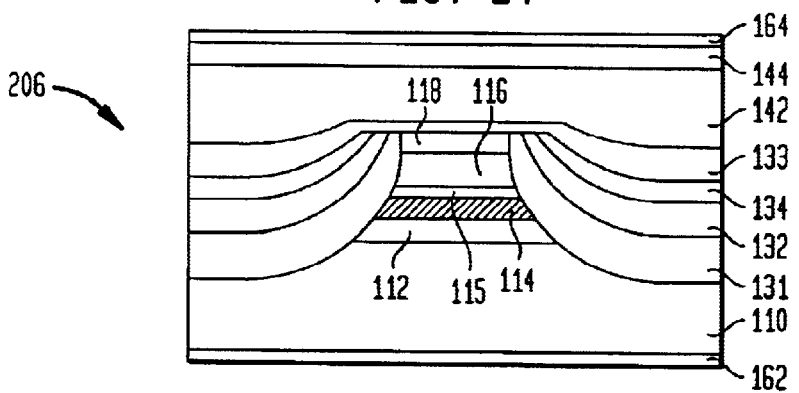
FIG. 24 is a cross-sectional view of a buried heterostructure laser diode at an intermediate stage of processing and in accordance with a sixth embodiment of the present invention.

Referring now to FIG. 13, after removal of the mask 200 and the optional removal of the Q layer 118, a third crystal growth is performed on the upper surfaces of the second current blocking layer 134 and the Q layer 118. Although the embodiments of the present invention are described as having the Q layer 118 incorporated into the mesa structure, it must be understood that the present invention also contemplates optoelectronic devices that do not include a Q layer, such as Q layer 118 (FIGS. 10–24). Further, although the embodiments of the present invention are described as having a first and a second current blocking layers, such as current blocking layers 132 and 134 (FIGS. 12–13; FIGS. 16–18; FIGS. 22–24), it must be understood that the present invention also contemplates optoelectronic devices with more than two current blocking layers as part of the second crystal growth, for example four current blocking layers with alternate doping conductivity.

As part of the third crystal growth, preferably a p-InP cladding layer 142 (FIG. 13) and a p-InGaAsP or a p-InGaAs ohmic contact layer 144 (FIG. 13) are further grown to form a buried heterostructure. The cladding layer 142 is preferably liquid-phase epitaxially grown or MOCVD grown to a thickness of 1.5 to 3 microns, preferably 2.5 microns, and doped with a p-type impurity atom, such as zinc (Zn), magnesium (Mg) or beryllium (Be). For example, doping can be conducted with diethyl zinc (DEZ), with H2 as carrier gas and at varying temperatures, from approximately −15° C. to 40° C. Similarly, the ohmic contact layer 144 may be, for example, a Zn-doped InGaAs preferably epitaxially grown layer, to a thickness of approximately 3000Angstroms.

An n-type electrode 162 (FIG. 13) is formed on the lower surface of the substrate 110 and a p-type electrode 164 (FIG. 13) is formed on the upper surface of the ohmic contact layer 144, to supply a voltage to the buried semi-insulating ridge heterostructure 201 which has an InAlAs 115 layer for blocking zinc diffusion into the active region 114 of the heterostructure.

Figure 14:
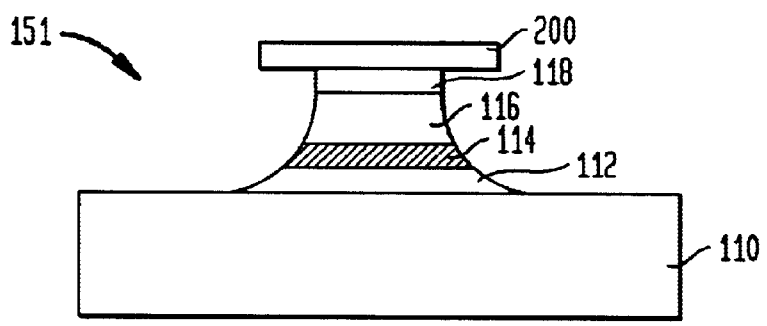
FIG. 14 is a cross-sectional view of a buried heterostructure laser diode at an intermediate stage of processing and in accordance with a second embodiment of the present invention.

In a second embodiment of the present invention (FIGS. 14–18), an InAlAs layer is selectively grown before the formation of the current blocking layers, which constitute the second crystal growth. To illustrate the second embodiment, reference is now made to FIG. 14, which illustrates a striped-shaped ridge structure (mesa stripe) 151, which is similar to the striped-shaped ridge structure 150 of FIG. 11 but without the InAlAs layer 115. Thus, the striped-shaped ridge 151 comprises portions of a first n-InP cladding layer 112, of the active layer 114, of the second p-InP(Zn) cladding layer 116, and of a Q layer 118. As illustrated in FIG. 14, the striped-shaped ridge 151 resides on an upper surface of the n-InP substrate 110.

Figure 15:
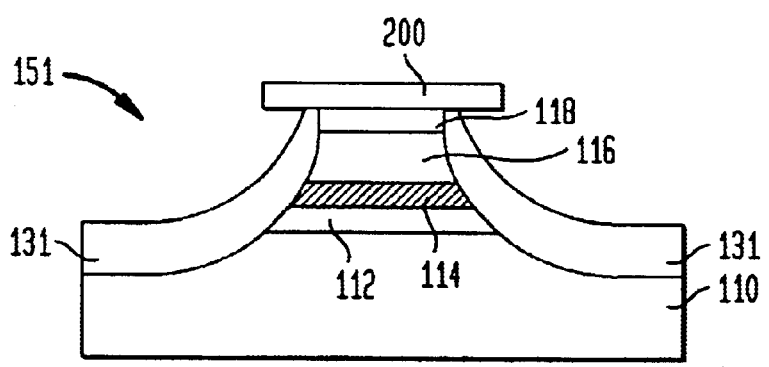
FIG. 15 is a cross-sectional view of the buried heterostructure laser diode of FIG. 14 at a stage of processing subsequent to that shown in FIG. 14.

Referring now to FIG. 15, the mesa stripe 151 of FIG. 14 is then introduced into a liquid phase epitaxial growth system or a MOCVD growth system to form an InAlAs layer 131. Preferably, the InAlAs layer 131 is grown selectively by Metal Organic Vapor Phase Epitaxy (MOVPE) around the striped-shaped ridge structure 151 and parts of the n-InP substrate 110. The InAlAs layer 131 may be epitaxially grown up to a thickness of between approximately 300 Angstroms to approximately 3000 Angstroms, sufficient to allow InAlAs layer 131 to suppress the zinc-iron lateral interdiffusion between the subsequently grown current blocking layers.

The InP first current blocking layer 132 (FIG. 16) is subsequently epitaxially grown around the striped-shaped ridge structure 151 and over the InAlAs layer 131. As explained above with reference to the first embodiment, the first current blocking layer 132 (FIGS. 12–13; FIG. 16) is doped with a semi-insulating type dopant, such as iron (Fe), in the range of $1 \times 10^{18}$ cm$^{-3}$ to $3 \times 10^{18}$ cm$^{-3}$, to form the semi-insulating InP(Fe) first current blocking layer 132.

The insertion of the InAlAs layer 131 between the mesa stripe 151 and the InP(Fe) first current blocking layer 132 prevents the direct contact between the p-InP(Zn) second cladding layer 116, which is on top of the active region 114, and the first semi-insulating current blocking layer InP(Fe)

132. This way, the Fe—Zn lateral interdiffusion that typically occurs in optoelectronic devices is suppressed since there is no contact between the two doped regions of the device.

At this point in the fabrication process, the subsequent steps proceed according to those described in the first embodiment and with respect to FIGS. 12–13. As such, once the InP(Si) second current blocking layer 134 (FIG. 16) is grown and the mask 200 removed, a p-InP cladding layer 142 (FIG. 17) is epitaxially grown on top of the second current blocking layer 134 and on top of the Q layer 118. Similarly, a p-InGaAsP or a p-InGaAs ohmic contact layer 144 is further grown over the p-InP cladding layer 142. Finally, an n-type electrode 162 and a p-type electrode 164 (FIG. 17) are formed on the lower surface of the substrate 110 and on the upper surface of the ohmic contact layer 144, respectively, so to form a complete buried semi-insulating ridge heterostructure 202 (FIG. 17).

Although the second embodiment has been described with reference to the mesa stripe 151 (FIGS. 14–17), which did not comprise an InAlAs layer (such as, for example, the InAlAs layer 115 of FIGS. 9–13 situated on top of the active region 114) or an InGaAlAs layer, it must be understood that the mesa stripe of the optoelectronic device may also comprise such an additional InAlAs or InGaAlAs layer situated on top of the active region. Such an example is illustrated in FIG. 18, in which the active region 114 is bounded by two InAlAs layers 131, 115. This way, Fe—Zn lateral interdiffusion, as well as Zn diffusion into the active region, are minimized and the characteristics of the optoelectronic device are maximized.

Figure 19:
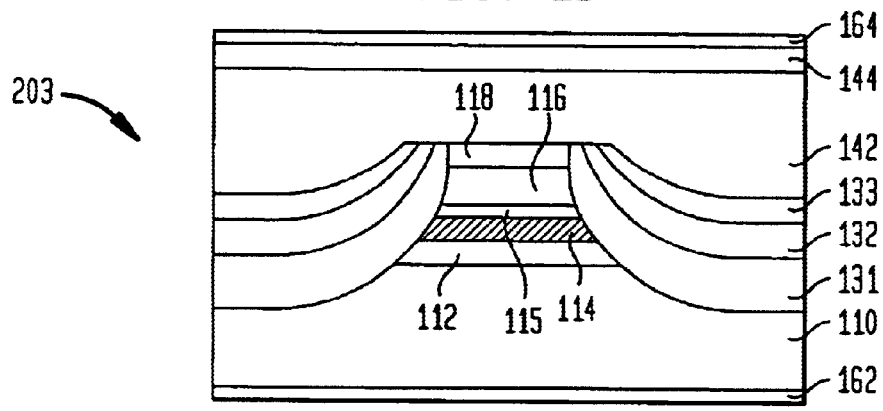
FIG. 19 is a cross-sectional view of a buried heterostructure laser diode at an intermediate stage of processing and in accordance with a third embodiment of the present invention.

In a third embodiment of the present invention, a plurality of InAlAs layers are grown around the mesa structure and in between different blocking layers forming the second crystal growth, optionally with a layer of InAlAs grown over the active region of the mesa structure. This embodiment is illustrated in FIG. 19. A buried heterostructure laser diode 203 fabricated according to the third embodiment of the present invention comprises at least three InAlAs layers 115, 131, and 133. The formation of the InAlAs layers 115, 131 has been discussed before with respect to the first and second embodiments of the present invention (FIGS. 8–13; FIGS. 14–18) and it will not be described again. The current embodiment is characterized by the InAlAs layer 133, which is selectively grown on top of the semi-insulating InP(Fe) first current blocking layer 132 (FIG. 19) and in lieu of the conventional n-InP(Si) second current blocking layer 134 (FIGS. 17–18). The insertion of an additional InAlAs layer as a current blocking layer further minimizes the lateral Fe—Zn interdiffusion and reduces any leakage current present in the device.

Figure 20:
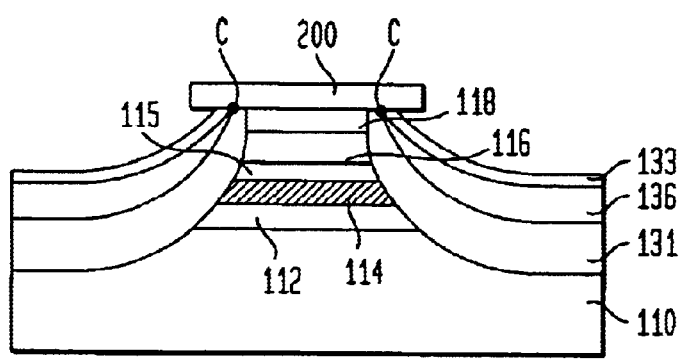
FIG. 20 is a cross-sectional view of a buried heterostructure laser diode at an intermediate stage of processing and in accordance with a fourth embodiment of the present invention.
Figure 21:
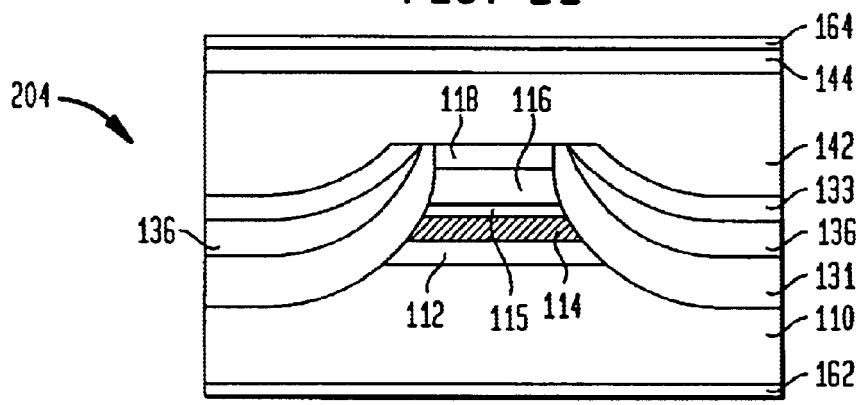
FIG. 21 is a cross-sectional view of the buried heterostructure laser diode of FIG. 20 at a stage of processing subsequent to that shown in FIG. 20.

FIGS. 20–21 illustrate a fourth embodiment of the present invention, in which the Zn—Fe interdiffusion between the InP(Fe) first current blocking layer 132 (FIG. 19) and the p-InP(Zn) cladding layer 142 (FIG. 19) is completely eliminated. In this embodiment and as shown in FIG. 20, after the epitaxial growth of the InAlAs layer 131, a selectively grown layer 136 of InP(Fe) first current blocking layer is formed over the InAlAs layer 131. This InP(Fe) first current blocking layer 136 is grown so that its contact with the mask 200 is minimal, for example, as illustrated in FIG. 20, just a point C on each side of the mesa stripe. Of course, point C is part of a contact line (not shown) formed by the InP(Fe) first current blocking layer 136 and the mask 200. Next, the InAlAs layer 133 (FIG. 20) that replaces the conventional n-InP(Si) second current layer 134 (FIGS. 17–18) is grown.

After removal of mask 200, the subsequent steps proceed according to those described in the first embodiment and with respect to FIG. 13. As such, a p-InP(Zn) cladding layer 142 and a p-InGaAsP or a p-InGaAs ohmic contact layer 144 are further grown. Because of the selective growth of the InP(Fe) first current blocking layer 136, the contact regions D (FIG. 5) situated on lateral sides of the mesa stripe are completely eliminated. Accordingly, the interdiffusion of the Fe and Zn atoms between the InP(Fe) first current blocking layer 136 and the p-InP(Zn) cladding layer 142 is eliminated. Further, the insertion of three InAlAs layers 115, 131, 133, of which two are on each side of the mesa stripe 151, suppresses any Fe—Zn interdiffusion that may be existent in the device, to ensure proper functionality.

The structure of FIG. 21 is further completed with an n-type electrode 162 and a p-type electrode 164 (FIG. 21) formed on the lower surface of the substrate 110 and on the upper surface of the ohmic contact layer 144, to form a buried semi-insulating ridge heterostructure 204, as illustrated in FIG. 21.

FIGS. 22–23 illustrate yet a fifth embodiment of the present invention. In this embodiment, the additional InAlAs 133 layer is selectively grown after both the InP(Fe) first current blocking layer 132 and the n-InP(Si) second current blocking layer 134, but still as part of the second crystal growth. Thus, the InAlAs layer 133 (FIG. 22) is grown before mask 200 is removed. After removal of the mask 200 (FIG. 23), the p-InP(Zn) cladding layer 142 and the ohmic contact layer 144 are grown, followed by the formation of the n-type electrode 162 and the p-tye electrode 164, to complete a buried semi-insulating ridge heterostructure 205 (FIG. 23).

In a sixth embodiment of the present invention, which is illustrated in FIG. 24, the additional InAlAs layer 133 is grown as part of the third crystal growth, and not as part of the second crystal growth as in the fifth embodiment. That is, in buried semi-insulating ridge heterostructure 206 of FIG. 24, the InAlAs layer 133 is grown after the removal of the mask 200 and before the growth of the p-InP(Zn) cladding layer 142. As illustrated in FIG. 24, the InAlAs layer 133 is grown over the mesa stripe 151 and the Q layer 118. Both InAlAs layers 115 and 131 suppress the diffusion of the Zn atoms from the p-InP(Zn) second cladding layer 116 into the active region 114, as well as the lateral diffusion of Zn from the mesa stripe and into the InP(Fe) first current blocking layer 132. Similarly, the InAlAs layer 133 further suppresses the interdiffusion of Zn and Fe atoms in the current blocking layers, that is between the InP(Fe) first current blocking layer 132 and the p-InP(Zn) cladding layer 142 of the buried semi-insulating ridge heterostructure 206.

Figure 25:
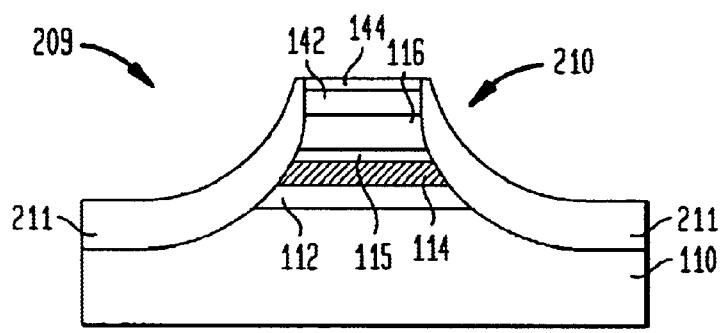
FIG. 25 is a cross-sectional view of a further embodiment of the present invention depicting a ridge structure for an optoelectronic device at an intermediate stage in the processing.

So far the present invention has been described in the context of a buried semi-insulating ridge heterostructure, such as, for example, the buried semi-insulating ridge heterostructure 204 of FIG. 21. However, the invention has broader applicability and can be used, for example, for the fabrication of a ridge structure for optoelectronic devices, such as electroabsorption modulators and detectors. In such case, which is illustrated in FIG. 25, a ridge structure 209, which resides on an upper surface of an n-InP substrate 110, comprises a vertical mesa stripe 210 surrounded by insulating layers 211. The vertical mesa stripe 210 further comprises portions of a first cladding layer 112, of an active layer 114, of an InAlAs or InGaAlAs layer 115, of a second cladding layer 116 of p-InP(Zn), of a p-InP cladding layer 142, and of a p-InGaAsP or a p-InGaAs ohmic contact layer 144. Preferably, all of the above-mentioned layers are grown selectively by Metal Organic Vapor Phase Epitaxy (MOVPE). However, Liquid Phase Epitaxy (LPE), Vapor Phase Epitaxy (VPE), or Molecular Beam Epitaxy (MBE) could also be used as an alternative. The insulating layers 211 are formed preferably of polyimide by a deposition method.

The present invention provides a method for reducing the diffusion of Zn and the Zn—Fe interdiffusion among doped regions of laser devices, optical amplifiers, modulators, or detectors. The direct contact between Zn-doped layers and Fe-doped layers is prevented and the dopant atoms interdiffusion is suppressed.

Although the invention has been illustrated for an optoelectronic device fabricated on an n-type substrate, the invention could also be fabricated on a p-type or a semi-insulating type substrate, as well-known in the art. This, of course, will change the doping or conductivity of the operative layers in the fabricated device. Also, although the invention has been explained in the exemplary embodiments with reference to an InAlAs dopant blocking layer, the invention has equal applicability to optoelectronic devices using an InGaAlAs dopant blocking layer, or a combination of both InAlAs and InGaAlAs layers, as noted above.

The above description illustrates preferred embodiments which achieve the features and advantages of the present invention. It is not intended that the present invention be limited to the illustrated embodiments. Modifications and substitutions to specific process conditions and structures can be made without departing from the spirit and scope of the present invention.

For example, although all embodiments of the present invention include the InAlAs or InGaAlAs layer 115 (FIGS. 9–13; FIGS. 18–25) situated on top of the active region of the optoelectronic device, it must be understood that the existence of such layer is optional in embodiments second through six, depending on the device characteristics and requirements. Similarly, as explained above, the embodiments of the present invention may include any number of additional InAlAs and/or InGaAlAs layers among the cladding and blocking layers that are doped with impurity atoms. For example, an InAlAs and/or InGaAlAs layer may be formed between the cladding layer and the ohmic contact layer of the third crystal growth. Accordingly, the invention is not to be considered as being limited by the foregoing description and drawings, but is only limited by the scope of the appended claims.

What is claimed as new and desired to be protected by Letters Patent of the United States is:

1. An optoelectronic device comprising:
   a substrate of a first type conductivity; and
   a mesa structure provided on said substrate, said mesa structure having a least two sides and including an active region, said mesa structure further being bounded on at least one side by an undoped dopant blocking layer, said undoped dopant blocking layer comprising a material selected from the group consisting of InAlAs and InGaAlAs, said undoped blocking layer having a thickness in the range of about 300 to 800 Angstroms.

2. The optoelectroric device of claim 1 further comprising a first current blocking layer at two sides of said mesa structure, a second current blocking layer of a first type conductivity formed over said first current blocking layer, and a cladding layer of a second type conductivity formed over said mesa structure and said second blocking layer.

3. The optoelectronic device of claim 1 further comprising a plurality of current blocking layers formed over said second current blocking layer.

4. The optoelectronic device of claim 1, wherein said dopant blocking layer is situated on top of said active region.

5. The optoelectronic device of claim 1 further comprising a doped second cladding layer of a second type conductivity in contact with said dopant blocking layer.

6. An optoelectronic device comprising:
   a substrate of a first type conductivity;
   a mesa structure provided on said substrate, said mesa structure having a least two sides and including an active region, said active region further being bounded on at least one side by an undoped dopant blocking layer, said undoped dopant blocking layer comprising a material selected from the group consisting of InAlAs and InGaAlAs;
   a first current blocking layer at two sides of said mesa structure;
   a second current blocking layer of a first type conductivity formed over said first current blocking layer; and
   a cladding layer of a second conductivity type formed over said mesa structure and said second blocking layer, said dopant blocking layer being situated between each of said two sides of said mesa structure and said first current blocking layer.

7. The optoelectronic device of claim 5, wherein said doped second cladding layer is doped with a p-type dopant.

8. The optoelectronic device of claim 1, wherein said dopant blocking layer is an epitaxially grown layer.

9. The optoelectronic device of claim 1, wherein said dopant blocking layer has a thickness in the range of about 300 to 800 Angstroms.

10. The optoelectronic device of claim 1, wherein said active region includes a layer capable of emitting light.

11. The optoelectronic device of claim 1, wherein said active region includes a layer capable of absorbing light.

12. The optoelectronic device of claim 1, wherein said active region includes a layer capable of modulating fight.

13. The optoelectronic device of claim 1, wherein said active region includes a layer capable of amplifying light.

14. The optoelectronic device of claim 1, wherein said dopant blocking layer comprises at least one InAlAs layer.

15. The optoelectronic device of claim 1, wherein said dopant blocking layer comprises at least one InGaAlAs layer.

16. The optoelectronic device of claim 1, wherein said dopant blocking layer comprises at least one layer of InAlAs and at least one layer of InGaAlAs.

17. A semiconductor optical device comprising:
   a substrate of a first type conductivity;
   a mesa structure provided on said substrate, said mesa structure having two sides and including an active region; and
   a first undoped dopant blocking layer at two sides of said mesa structure, said undoped dopant blocking layer comprising a material selected from the group consisting of InAlAs and InGaAlAs.

18. The semiconductor optical device of claim 17 further comprising a plurality of current blocking layers formed over said first dopant blocking layer.

19. The semiconductor optical device of claim 17, wherein said first dopant blocking layer comprises at least one InAlAs layer.

20. The semiconductor optical device of claim 17, wherein said first dopant blocking layer comprises at least one InGaAlAs layer.

21. The semiconductor optical device of claim 17, wherein said first dopant blocking layer is an epitaxially grown layer.

22. The semiconductor optical device of claim 17, wherein said first dopant blocking layer has a thickness in the range of about 300 to 3000 Angstroms.

23. The semiconductor optical device of claim 17 further comprising a first current blocking layer formed over said first dopant blocking layer, a second current blocking layer of a first type conductivity formed over said first current blocking layer, and a cladding layer of a second type conductivity formed over said mesa structure and said second blocking layer.

24. The semiconductor optical device of claim 23, wherein said first current blocking layer is doped.

25. The semiconductor optical device of claim 24, wherein said dopant is a semi-insulating type dopant.

26. The semiconductor optical device of claim 25, wherein said first current blocking layer is an InP(Fe) layer.

27. The semiconductor optical device of claim 23, wherein said second current blocking layer is doped with a dopant selected from the group consisting of silicon, sulfur and tin.

28. The semiconductor optical device of claim 23, wherein said mesa structure further comprises a second cladding layer formed over said active region.

29. The semiconductor optical device of claim 23, wherein said mesa structure further comprises a second undoped dopant blocking layer formed in between said second cladding layer and said active region.

30. The semiconductor optical device of claim 29, wherein said second dopant blocking layer comprises a material selected from the group consisting of InAlAs and InGaAlAs.

31. The semiconductor optical device of claim 29, wherein said second dopant blocking layer comprises at least one InAlAs layer.

32. The semiconductor optical device of claim 29, wherein said second dopant blocking layer comprises at least one InGaAlAs layer.

33. The semiconductor optical device of claim 29, wherein said second dopant blocking layer comprises at least one layer of InAlAs and at least one layer of InGaAlAs.

34. The semiconductor optical device of claim 17, wherein said active region includes a layer capable of emitting light.

35. The semiconductor optical device of claim 17, wherein said active region includes a layer capable of absorbing light.

36. The semiconductor optical device of claim 17, wherein said active region includes a layer capable of modulating light.

37. The semiconductor optical device of claim 17, wherein said active region includes a layer capable of amplifying light.

38. A semiconductor optical device comprising:
    a substrate of a first type conductivity;
    a mesa structure provided on said substrate, said mesa structure having two sides and including an active region, said mesa structure further including a first undoped dopant blocking layer in contact with said active region, said first undoped dopant blocking layer comprising a material selected from the group consisting of InAlAs and InGaAlAs; and
    a second undoped dopant blocking layer at two sides of said mesa structure.

39. The semiconductor optical device of claim 38 further comprising a first current blocking layer formed over said second dopant blocking layer, a third dopant blocking layer formed over said first current blocking layer, and a cladding layer of a second type conductivity formed over said mesa structure and said third dopant blocking layer.

40. The semiconductor optical device of claim 39 further comprising a plurality of current blocking layers formed in between said first current blocking layer and said third dopant blocking layer.

41. The semiconductor optical device of claim 39, wherein said second dopant blocking layer comprises a material selected from the group consisting of InAlAs and InGaAlAs.

42. The semiconductor optical device of claim 39, wherein said third dopant blocking layer comprises a material selected from the group consisting of InAlAs and InGaAlAs.

43. The semiconductor optical device of claim 39, wherein said first dopant blocking layer is situated on top of said active region.

44. The semiconductor optical device of claim 39 further comprising a doped second cladding layer of a second type conductivity in contact with said first and second dopant blocking layers.

45. The semiconductor optical device of claim 44, wherein said doped second cladding layer is doped with a p-type dopant.

46. The semiconductor optical device of claim 39, wherein said second dopant blocking layer has a thickness in the range of about 300 to 3000 Angstroms.

47. The semiconductor optical device of claim 39, wherein said third dopant blocking layer has a thickness in the range of about 300 to 3000 Angstroms.

48. The semiconductor optical device of claim 38, wherein said first dopant blocking layer has a thickness in the range of about 300 to 800 Angstroms.

49. The semiconductor optical device of claim 38, wherein said active region includes a layer capable of emitting light when excited.

50. The semiconductor optical device of claim 38, wherein said active region includes a layer capable of absorbing light.

51. The semiconductor optical device of claim 38, wherein said active region includes a layer capable of modulating light.

52. The semiconductor optical device of claim 38, wherein said active region includes a layer capable of amplifying light.

* * * * *